US006946301B2

(12) United States Patent
Lim et al.

(10) Patent No.: US 6,946,301 B2
(45) Date of Patent: Sep. 20, 2005

(54) METHOD OF FABRICATING GE-MN MAGNETIC SEMICONDUCTORS WITH HIGH CURE TEMPERATURE

(75) Inventors: Sang Ho Lim, Seoul (KR); Sang Hoon Song, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 104 days.

(21) Appl. No.: 10/687,903

(22) Filed: Oct. 17, 2003

(65) Prior Publication Data

US 2004/0182307 A1 Sep. 23, 2004

(30) Foreign Application Priority Data

Feb. 5, 2003 (KR) ................................ 10-2003-0007079

(51) Int. Cl.[7] ................................................ H01L 21/00
(52) U.S. Cl. .............................. 438/3; 438/308; 117/88
(58) Field of Search ............................ 438/3, 9, 10, 88, 438/308, 771, 772, 776; 117/88, 98, 951

(56) References Cited

U.S. PATENT DOCUMENTS 4,132,571 A * 1/1979 Cuomo et al. .............. 438/488

* cited by examiner

*Primary Examiner*—Phuc T. Dang
(74) *Attorney, Agent, or Firm*—Harness, Dickey & Pierce, P.L.C.

(57) ABSTRACT

The invention relates to a fabrication method of Ge—Mn magnetic semiconductor with a high Curie temperature. To date, most of researches in magnetic semiconductor are constrained to the magnetic semiconductors from group II-VI and group III-V.

However, a new range of semiconductors from group IV has been recently added. Especially, Ge based semiconductors are attracting a significant attention. These magnetic semiconductors have very low Curie temperatures whose maximum is around 116 K. The low Curie temperature is a major stumbling block for commercial development. The exact reason for the low Curie temperature is not known, however, this is probably due to the low content of Mn.

In order to resolve this problem, the present invention utilizes the thermal evaporation method to fabricate amorphous Ge—Mn alloys. As a result, a large amount of Mn is made solid soluble in Ge without any precipitation. Also, a relatively high Curie temperature of 250 K is obtained. This method is expected to be used as the essential element in the development of spin electronic devices

2 Claims, 7 Drawing Sheets

METHOD OF FABRICATING GE-MN MAGNETIC SEMICONDUCTORS WITH HIGH CURE TEMPERATURE

BACKGROUND OF THE INVENTION

The present invention relates to a fabrication method of Ge—Mn magnetic semiconductor by adding a transient metal Mn into a Group IV semiconductor Ge. More particularly, the invention relates to a fabrication method of Ge—Mn magnetic semiconductor with a high Curie temperature by converting the microstructure of the magnetic semiconductor into an amorphous structure and adding a large amount of Mn solid solution.

As Moore's law vindicates, the electronic devices including semiconductor IC have been undergoing a continuous cycle of progressive development. As a result, the electronic device development is considered to be getting closer to the technological limit. Many types of technologies have to be considered for fundamentally resolving this problem and the next generation spin electronic device technology is one of the strong candidates which is attracting a significant attention at present.

The essence of the spin electronic device technology is simultaneously utilizing the characters such as charge and spin from the classical dynamics and quantum mechanics, respectively. The present electronics technology only employs the charge character from the classical dynamics. Hence, in order to fabricate a spin electronic device, in addition to the technology for controlling the charge of an electron in semiconductor, the technology to control the spin of an electron is also necessary.

The spin electronic control technology encompasses the techniques of spin injection, transfer and detection. The spin injection is especially important among these techniques. The reason is that the length of spin coherence is on the order of a few hundred $\mu$m and the techniques of either electrically or optically detecting spin are relatively well established.

The method which was first proposed for injecting spin into a semiconductor is utilizing ferromagnetic materials. More specifically, ferromagnetic material/semiconductor hybrid structures are used. While electrons are passing through the hybrid structure of a ferromagnetic material, a polarization occurs. Then, this polarized spin is injected into the semiconductor.

Ferromagnetic materials include transition metals such as iron, cobalt, nickel or their alloys. The spin polarization rate of the transition metals and their alloys is around 50%. The hybrid structure for injecting spin is a relatively simple one. Since the Curie temperatures of ferromagnetic transition metals are mostly higher than room temperature, it is advantageous for the perspective of commercial development of spin electronic devices.

However, the spin injection rate so far obtained from the hybrid structure of these ferromagnetic metals/semiconductors is much lower than expected. At the beginning, the inferior results were interpreted as occurring from an improper control of the surface characteristics. However, more recently, it was thought to be caused by more fundamental phenomena such as a mismatch of energy band structure between the metals and semiconductors.

A magnetic semiconductor is one of methods that have been developed to tackle this problem. More specifically, the magnetic semiconductor is utilized instead of a ferromagnetic metal in the metal/semiconductor hybrid structure. At present, two types of magnetic semiconductors are actively being researched. One of them is magnetic semiconductor from group II-VI and the other is from group III-V.

The magnetic semiconductors from group II-VI have a spin polarization efficiency of almost 100%. They also have very good spin injection properties. However, their Curie temperatures are so low that they can only be obtained at liquid helium temperature and the good spin injection properties are obtained under the influence of a strong magnetic field.

In comparison, the recently developed magnetic semiconductors from group III-V have much higher Curie temperatures than those from group II-VI. However, their Curie temperatures are still below room temperature. This is a major stumbling block to their commercial development. As a result, one of the most important issues in the development of magnetic semiconductor is raising the Curie temperature.

To date, most of researches in magnetic semiconductors are constrained to the magnetic semiconductors from group II-VI and group III-V. However, a new range that was added recently is the semiconductors from group IV. Especially, Ge based semiconductors are attracting a significantly attention. Like the magnetic semiconductors from group III-V, the ferromagnetic property is imparted to Ge by adding 3d transition metals to Ge. Most representative transition metal is Mn.

However, the solid solubility of Ge and Mn are very low hence causing difficulty in making a large amount of Mn solid solution. Also, this is a major problem for raising the Curie temperature. In order to resolve this problem, a low temperature. MBE method has been utilized. Y. D. Park et al., disclosed the method of making an Mn solid solution of 3.5 atomic % in Ge using the low temperature MBE method ("A Group IV ferromagnetic semiconductor: MnxGe1-x", Science 295, pp. 651–654 (2202)). At this instance, the Curie temperature is 116 K which is much lower than room temperature. This may be due to insufficient amount of Mn.

SUMMARY OF THE INVENTION

The present invention is designed to overcome the above problems of prior art. The object of the present invention is to provide a fabrication method of ferromagnetic semiconductor with a high Curie temperature by adding a large amount of Mn into Ge without forming any precipitates. The microstructure of the present invention was an amorphous structure. More specifically, a thin layer of amorphous Ge—Mn alloy with a large amount of Mn is fabricated using a thermal evaporation method. A much higher Curie temperature was obtained in the thin film of amorphous Ge—Mn alloy with a large amount of Mn. In addition to the increase in the Curie temperature, a large increase in saturation magnetization is also achieved.

The fabrication method of Ge—Mn magnetic semiconductor according to the present invention comprises the steps of: designing Ge—Mn alloy by reflecting the thermodynamic characteristics of Ge semiconductor and Mn magnetic metal; applying different heat energy to each of Ge semiconductor and Mn magnetic metal using co-thermal evaporation method and fabricating a thin film of amorphous Ge—Mn alloy using the co-thermal evaporation method.

At this instance, the thin film of Ge—Mn alloy maintains a single amorphous phase up to a high percentage (0–48 atomic %) of Mn atoms.

DETAILED DESCRIPTION OF THE EMBODIMENTS

Hereinafter, preferred embodiments of the present invention will be described in detail with reference to the accompanying drawings.

[Preferred Embodiment]

The apparatus utilized for the fabrication of Ge—Mn magnetic semiconductor with a high Curie temperature according to the preferred embodiment of the present invention is a co-thermal evaporation apparatus. The co-thermal evaporation apparatus simultaneously evaporates the base material using two thermal sources. More specifically, a boat is interconnected between two electrodes and then electrical energy is applied to the boat. The base material which is contained in the boat is either evaporated or sublimated by the heat generated through the electrical resistance of the boat. The mechanism which evaporates or sublimates the base material is dependent upon the type of the base materials contained in the boat. For the base materials used for the present invention are Ge and Mn. For the case of Ge, the main mechanism is evaporation. For the case of Mn, it is sublimation.

At this instance, the boat is manufactured by a tungsten panel with thickness of 0.3 mm and the total length and width are 100 mm and 10 mm respectively. The length and depth of the section in which the base material is to be contained are 50 mm and 2 mm respectively. Each of Ge and Mn is contained in two different boats and electrical energy is applied afterwards. The distance between the two boats is maintained at 65 mm. In order to produce thin films of amorphous Ge—Mn alloys with a variety of compositions, the magnitude of the power applied to the tungsten boats where the base materials are contained is varied. A p-type wafer is used for Si (100) substrate and the distance between the substrate and boat is maintained at 180 mm. The vacuum pressure is maintained at pressure of $2\times10^{-6}$ Torr and the thickness of the manufactured thin film is between 0.1 $\mu$m and 1 $\mu$m.

In the present invention, a thin film of amorphous Ge100-xMnx alloy is fabricated using the co-thermal evaporation method. Here, x represents the content Mn (atomic %) in Ge—Mn binary alloy. The composition according to the present invention is in the range $0\leqq x\leqq 48$. The microstructure analysis of the thin film is carried out by x-ray diffraction analysis. The absence of clear diffraction peaks proves that the Ge—Mn alloy thin film is amorphous. The Ge—Mn alloy thin film fabricated according to the present invention is a single phase amorphous material.

Figure 1:
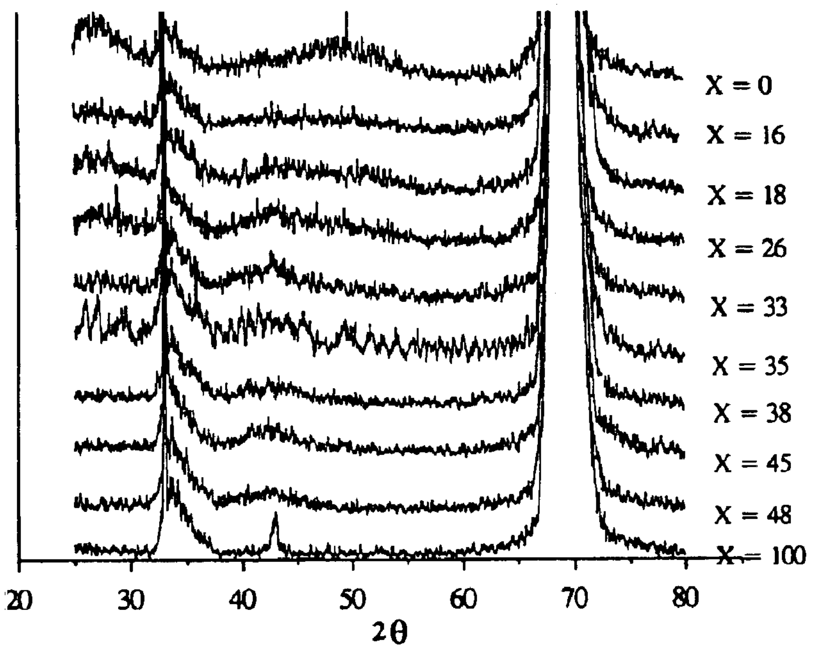
FIG. 1 shows the result of X-ray diffraction analysis of thin films of amorphous Ge—Mn alloys fabricated according to the present invention.

FIG. 1 shows the result of x-ray diffraction analysis of the thin film of Ge—Mn alloy fabricated according to the present invention.

Figure 2:
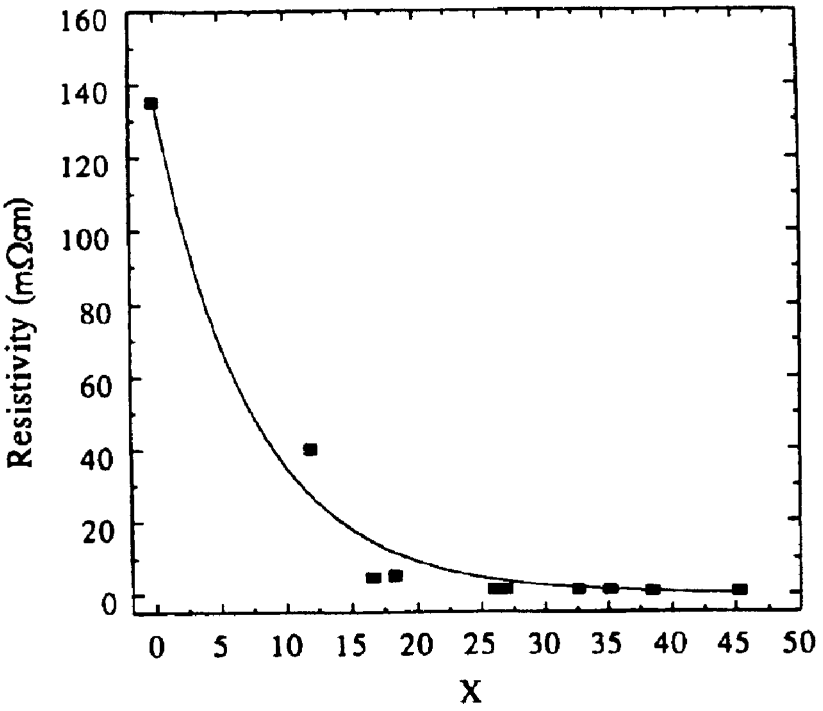
FIG. 2 shows the variation of resistivity at room temperature according to the content of Mn.

The diffraction peaks near 33 and 69 degrees in FIG. 1 are from Si which is used as the substrate. The resistivity of the thin film of Ge—Mn alloy fabricated according to the present invention is measured by a four point method. FIG. 2 shows the variation of the resistivity at room temperature according to the Mn content. The resistivity value of amorphous Ge without the Mn content is 135 mΩcm and the resistivity value decreases with an increase of Mn content. The resistivity value with a Mn content of 45 atomic % is 0.478 mΩcm.

With a higher value of Mn content, i.e., the thin films with a Mn content over 30 atomic %, the resistivity value becomes less than 1 mΩcm. The variation of the resistivity values with the Mn content becomes very small. This similar resistivity property is also seen in the case of amorphous metal. In order to determine the electrical characteristics of the thin film of amorphous Ge—Mn alloy fabricated according to the present invention, the temperature dependence of resistivity is investigated.

Figure 3:
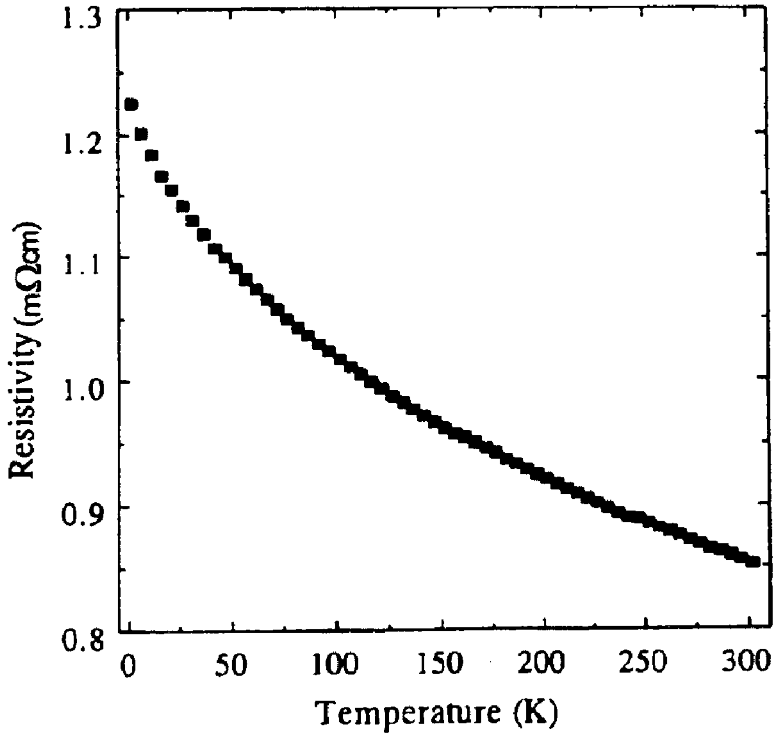
FIG. 3 shows that the resistivity values which decrease with respect to an increase in temperature.
Figure 4:
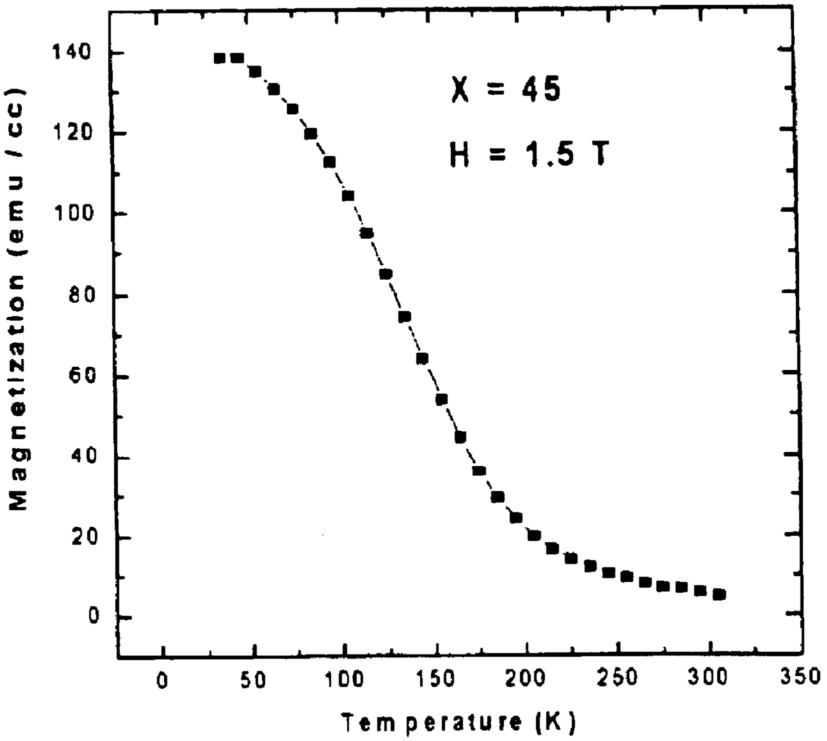
FIG. 4 through FIG. 11 shows the results of the temperature dependence of magnetization with respect to various Mn contents.
Figure 5:
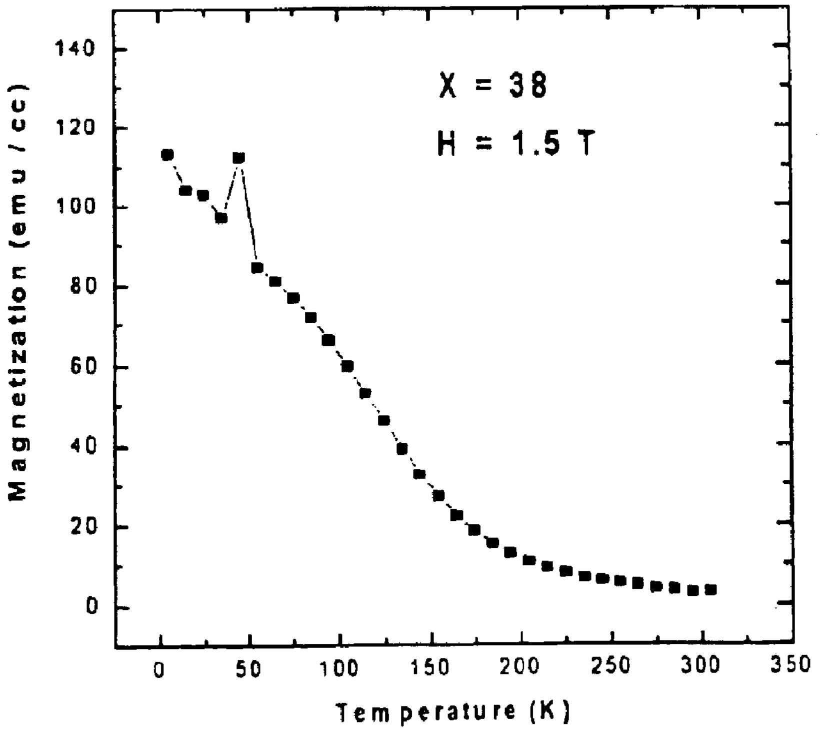
Figure 6:
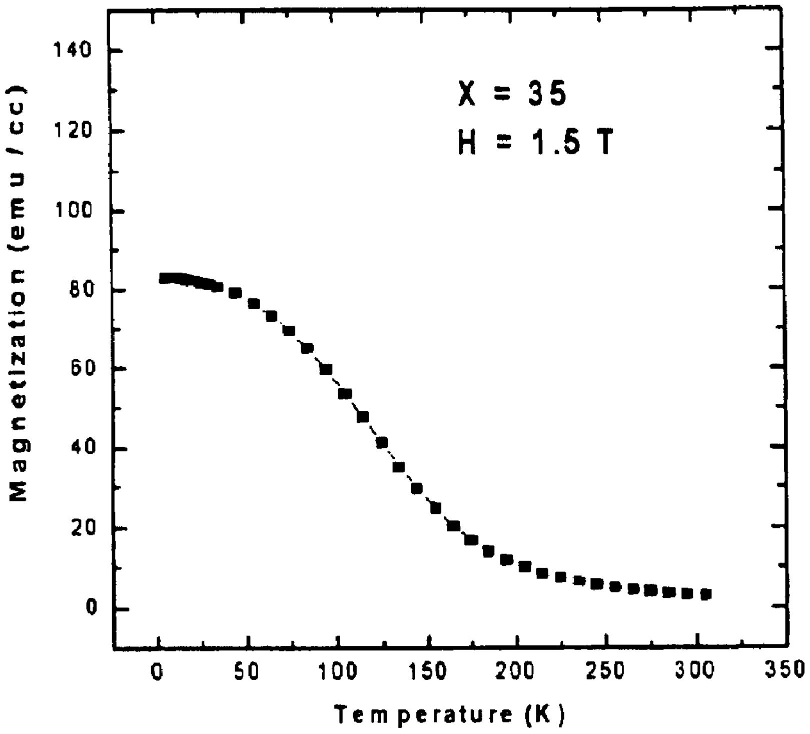
Figure 7:
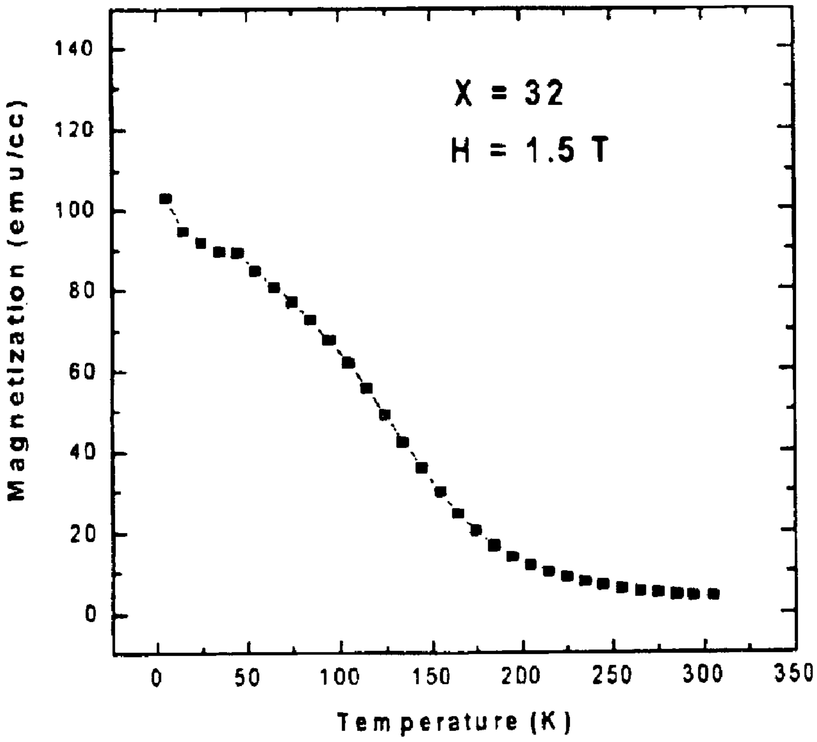
Figure 8:
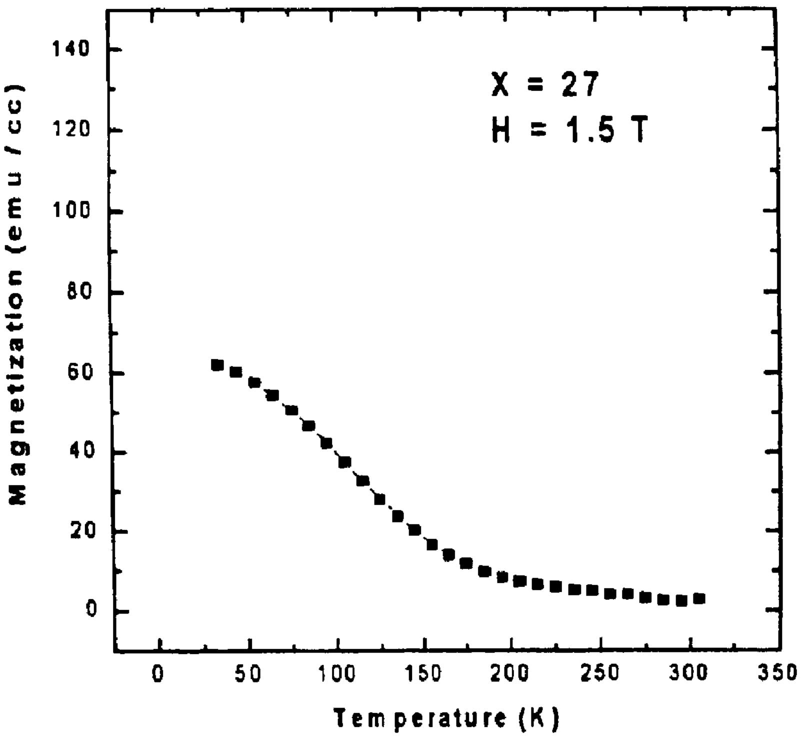
Figure 9:
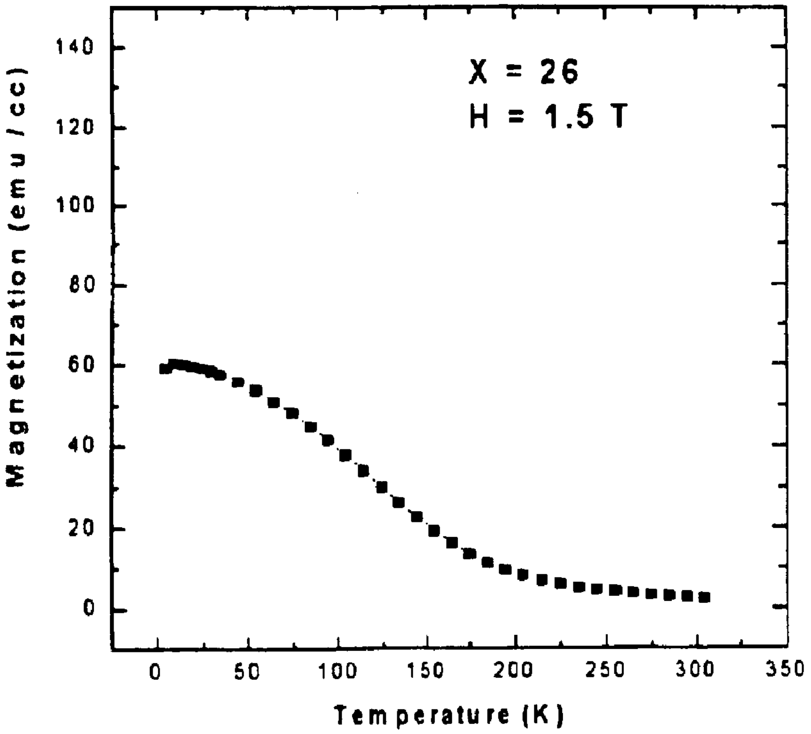
Figure 10:
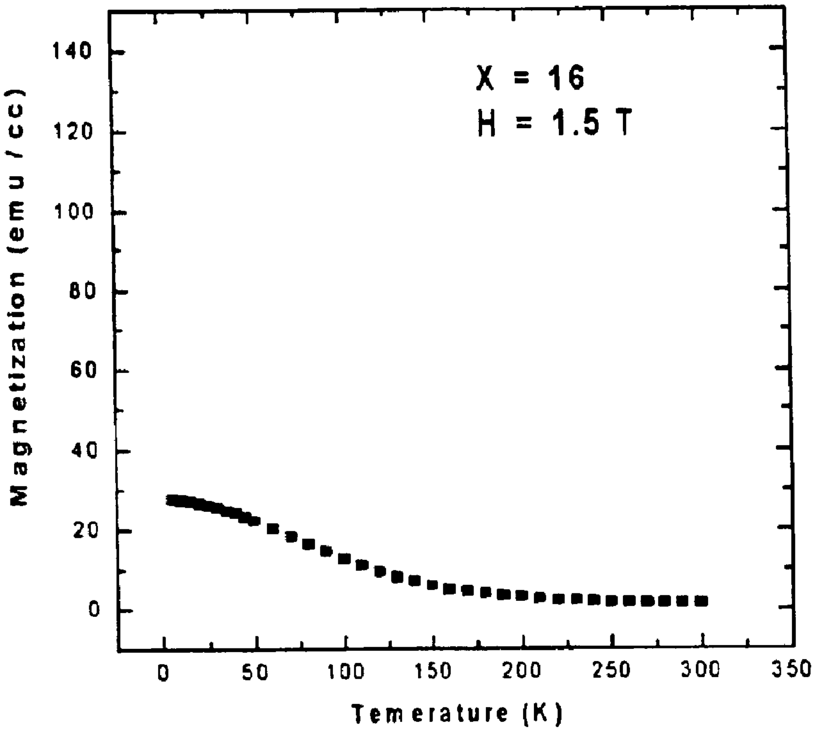
Figure 11:
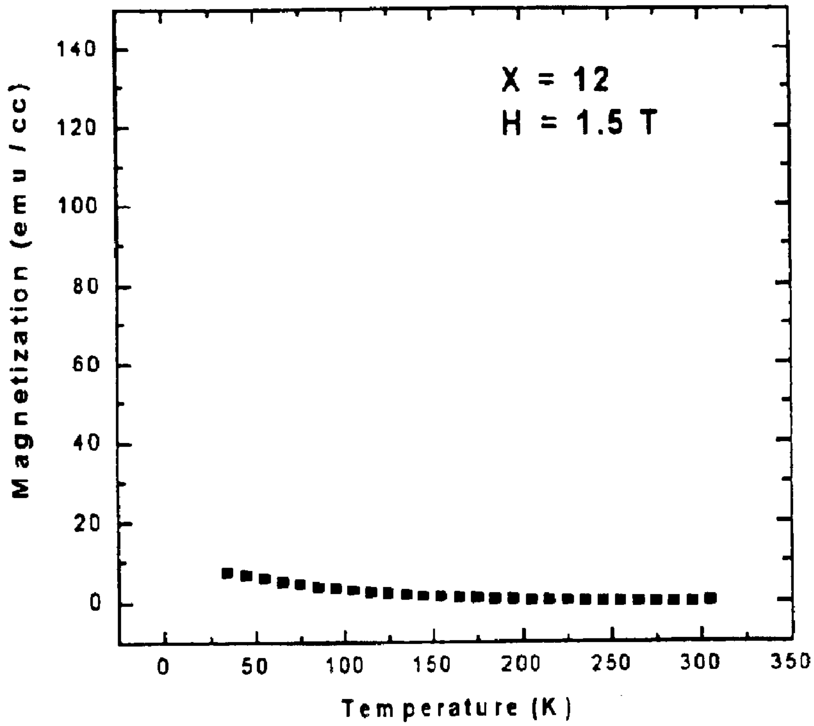

FIG. 3 shows that the resistivity value which decreases with respect to an temperature increase. From the resistivity values at room temperature in FIG. 2 and the temperature dependence characters of the resistivity is as shown in FIG. 3, it can be deduced that the thin film of amorphous Ge—Mn alloy fabricated according to the present invention is a semiconductor.

In order to investigate the Curie temperature of the thin film of amorphous Ge—Mn alloy fabricated according to the present invention, the temperature dependence of magnetization is measured by SQUID. From FIG. 4 through FIG. 11 shows the results of the temperature dependence of magnetization with respect to various Mn contents. The results are measured while the magnetic filed is maintained at 1.5 T. The Curie temperature is measured from the result of the temperature dependence of magnetization. More specifically, after converting the magnetization-temperature curve to a magnetization-$(\text{temperature})^{-1}$ curve, the Curie temperature is determined to be the point where the magnetization values vs. $(\text{temperature})^{-1}$ plot starts to deviate from the straight line.

Figure 12:
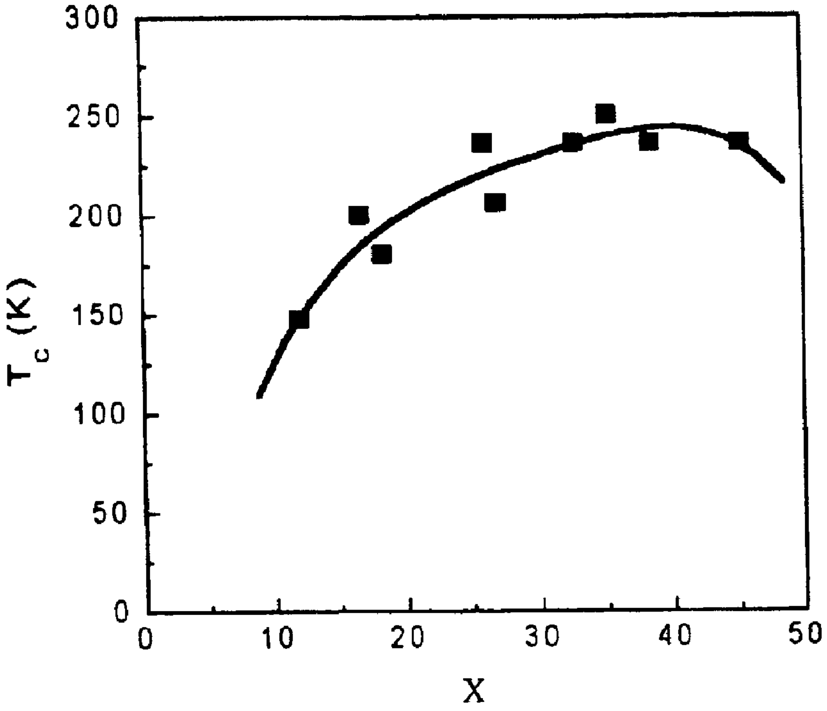
FIG. 12 shows the Curie temperature variation with respect to the Mn content.
Figure 13:
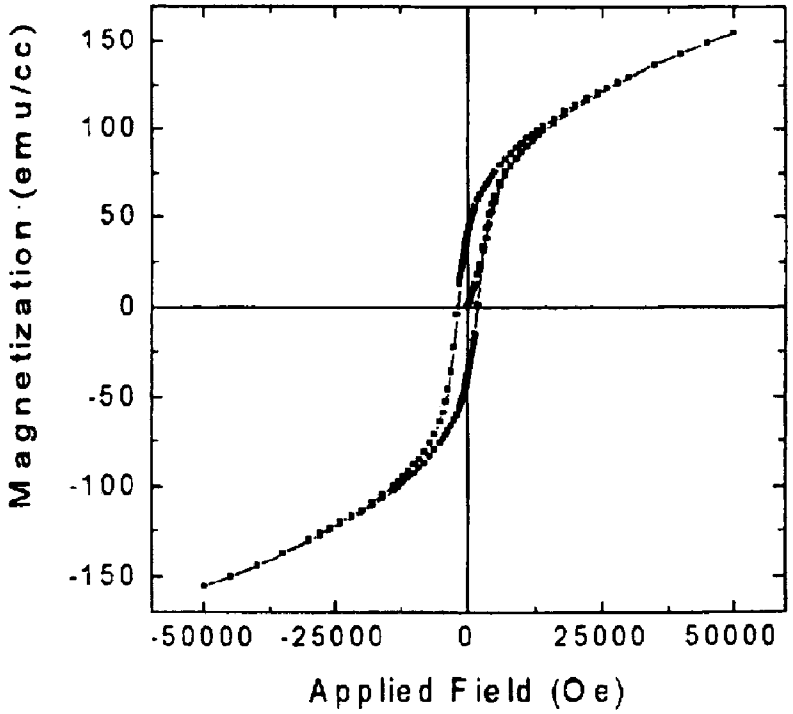
FIG. 13 shows the magnetic hysteresis of a thin film of amorphous Ge—Mn alloy at a temperature of 5 K.

FIG. 12 shows the Curie temperature variation with respect to the Mn content. FIG. 13 shows the magnetic hysteresis of amorphous $Ge_{67}Mn_{33}$ alloy layer at a temperature of 5 K. It shows that no magnetization saturation occurs even at the maximum applied field value of 50 kOe. The value of magnetization saturation at the maximum applied field is around 155 emu/cc. This value for the thin film of Ge—Mn alloy is 5 times larger than the magnetization saturation value of 30 emu/cc which was previously disclosed by Y. D. Park et al ("A Group IV Ferromagnetic Semiconductor: MnxGe1-x", Science 295, pp. 651–654 (202)). Also, the coercive value is found to be about 2000 Oe.

Since the results of the previously conducted researches are mainly on the magnetic semiconductors with a small amount Mn (less than atomic 10%), the characteristics of the magnetic semiconductors with a large amount of solid soluble magnetic element are not very well known.

However, according to the present invention, Ge—Mn magnetic semiconductors with a large amount of Mn content could be fabricated while maintaining a single phase. This is a new attempt which uses the amorphous characteristics and this method could be used as an essential element in the development of spin electronic devices.

What is claimed is:

1. A fabrication method of Ge—Mn magnetic semiconductor with a high Curie temperature, comprising the steps of:

designing a thin film of Ge—Mn alloy by reflecting the thermodynamic characteristics of Ge semiconductor and Mn magnetic metal; and applying different heat energy to each of Ge semiconductor and Mn magnetic metal using the co-thermal evaporation method and fabricating a thin film of amorphous Ge—Mn alloy using the co-thermal evaporation method.

2. The method as claimed in claim 1, wherein said thin film of Ge—Mn alloy maintains a single phase and the microstructure of the alloy is an amorphous structure in order to contain a high percentage (0–48 atomic %) of magnetic metal.

* * * * *